United States Patent
Sukekawa

(10) Patent No.: US 8,541,316 B2
(45) Date of Patent: Sep. 24, 2013

(54) METHOD OF MANUFACTURING SEMICONDUCTOR DEVICE INCLUDING SEQUENTIALLY FORMING FIRST AND SECOND MASK MATERIAL LAYERS AND FORMING A DOTTED PHOTORESIST PATTERN ON THE SECOND MASK MATERIAL LAYER

(75) Inventor: Mitsunari Sukekawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 228 days.

(21) Appl. No.: 13/067,285

(22) Filed: May 20, 2011

(65) Prior Publication Data
US 2011/0294297 A1 Dec. 1, 2011

(30) Foreign Application Priority Data
May 27, 2010 (JP) .................................. 2010-121639

(51) Int. Cl.
*H01L 21/31* (2006.01)
*H01L 21/76* (2006.01)

(52) U.S. Cl.
USPC ............................ 438/761; 438/778; 438/421

(58) Field of Classification Search
None
See application file for complete search history.

(56) References Cited

U.S. PATENT DOCUMENTS

| 6,627,529 | B2 * | 9/2003 | Ireland ........................... 438/619 |
| 2002/0025653 | A1 * | 2/2002 | Sasaki ............................ 438/421 |
| 2008/0017992 | A1 | 1/2008 | Kito et al. |
| 2008/0081461 | A1 | 4/2008 | Lee et al. |
| 2009/0017631 | A1 * | 1/2009 | Bencher ......................... 438/703 |
| 2010/0130011 | A1 * | 5/2010 | Endoh et al. ................... 438/689 |
| 2010/0314715 | A1 * | 12/2010 | Fujimoto ...................... 257/532 |

FOREIGN PATENT DOCUMENTS

| JP | 2008-27978 A | 2/2008 |
| JP | 2008-91925 A | 4/2008 |

* cited by examiner

*Primary Examiner* — Scott B Geyer
(74) *Attorney, Agent, or Firm* — McGinn IP Law Group, PLLC

(57) ABSTRACT

In a method of forming a dense contact-hole pattern in a semiconductor device, the method uses a self-align double patterning technique including forming a square or triangular lattice dot pattern on double layers of mask materials, forming first holes in the upper mask material and second holes wider than the first holes in the lower mask material by double patterning, additionally forming an insulating layer to a thickness such that the first holes are closed such that voids are left in the second holes, and transferring the shape of the voids to a base layer.

7 Claims, 9 Drawing Sheets

AB

METHOD OF MANUFACTURING SEMICONDUCTOR DEVICE INCLUDING SEQUENTIALLY FORMING FIRST AND SECOND MASK MATERIAL LAYERS AND FORMING A DOTTED PHOTORESIST PATTERN ON THE SECOND MASK MATERIAL LAYER

BACKGROUND OF THE INVENTION

1. Field of the Invention

The present invention relates, in general, to a method of manufacturing a semiconductor device and, more particularly, to a method of forming a densely-packed contact-hole pattern in a semiconductor device.

2. Description of the Related Art

In response to the miniaturization of semiconductor devices, it becomes more difficult to form microscopic patterns by lithography techniques. For this, there are self-align double pattern techniques, in which the line pitch can be halved by forming spacers on a sidewall, which has a pattern achievable by a lithography technique, followed by processing using the spacer as a mask (JP 2008-27978 A, and JP 2008-91925 A). In addition, there is a self-align double patterning technique devised by applying the above techniques to a dense contact-hole pattern. In the fourth example of JP 2008-91925 A, there is disclosed a method forming a column of rectangular contact-holes, which has a half pitch of a column of initial rectangular patterns (first hard mask patterns).

However, in such techniques, the size of the gap formed between the spacers varies depending on the size of the initial pattern. Therefore, there is a problem in that it is difficult to set the gap size to be uniform. In addition, in the case of intending to form more densely-packed holes, that is, to form a capacitor in a dense pattern, such as 6F2 type, in a semiconductor memory device such as Dynamic Random Access Memory (DRAM), the shapes of the resultant holes are classified into two types, including a shape to which the initial pattern shape is reflected and a shape to which the spacer gap shape is reflected.

SUMMARY

The present invention provides a technique of forming densely-packed contact-hole patterns in a semiconductor device, and more particularly, a method of manufacturing a semiconductor device, in which a high-precision hole pattern is formed by a self-align double patterning technique, at a density (number) that is double or triple that of a pattern achievable by lithography techniques.

In an embodiment of the present invention, the method of manufacturing a semiconductor device includes the processes of:

sequentially forming mask material layers A and B on a base layer;

forming a plurality of dotted photoresist patterns in a square or triangular lattice layout on the mask material layer B;

forming a first insulating film, which is intended to form sidewall spacers, on the whole surfaces, with a recess left at least in the vicinity of a central portion of each square or triangular lattice of the dotted photoresist patterns;

etching back the first insulating film by dry etching to expose the photoresist, removing the photoresist that is exposed and forming the sidewall spacers by further etching back, wherein the sidewall spacers have a photoresist-removed portion that exposes the mask material layer B and a first hole pattern corresponding to the recess;

etching the mask material layer B using the sidewall spacers as a mask to form second holes corresponding to the first hole pattern in the mask material layer B;

etching the mask material layer A using the remained mask material layer B as a mask to form third holes in the mask material layer A by, wherein the third holes have a diameter greater than that of the second holes of the mask material layer B;

forming a second insulating layer on the mask material layer B to a thickness such that openings of the second holes are closed to form voids in the third holes of the mask material layer A;

forming a mask pattern exposing the base film in fourth holes corresponding to the voids in the third holes by dry etching; and forming holes corresponding to the fourth holes by etching the base layer using the mask pattern as a mask.

According to embodiments of the invention, it is possible to form a uniform hole pattern having a diameter smaller than that of the initial dotted photoresist pattern, with the number (density) of the holes being double or triple that of the dotted photoresist pattern in a predetermined area.

BRIEF DESCRIPTION OF THE DRAWINGS

The above features and advantages of the present invention will be more apparent from the following description of certain preferred embodiments taken in conjunction with the accompanying drawings, in which:

FIGS. 1A to 8B are views showing a process of manufacturing a semiconductor device according to an embodiment of the invention, in which FIGS. 1A, 2A, 3A, 4A, 5A, 6A, 7A, and 8A are plan views, and FIGS. 1B, 2B, 3B, 4B, 5B, 6B, 7B, and 8B are cross-sectional views.

FIGS. 9A and 9B are views showing a method of manufacturing a semiconductor device according to an embodiment of the invention, in which FIG. 9A is a plan view showing a state in which a dotted photoresist pattern is arranged in a square lattice layout, and FIG. 9B is a plan view showing a state in which a hole pattern is formed in the square lattice layout shown in FIG. 9A according to the present invention.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

A fabrication method according to an embodiment of the invention is described with reference to FIGS. 1A to 8B. FIGS. 1A, 2A, 3A, 4A, 5A, 6A, 7A, and 8A, which are plan views, and FIGS. 1B, 2B, 3B, 4B, 5B, 6B, 7B, and 8B, which are cross-sectional views taken along line A-B in FIGS. 1A, 2A, 3A, 4A, 5A, 6A, 7A, and 8A, respectively.

Figure 1A:
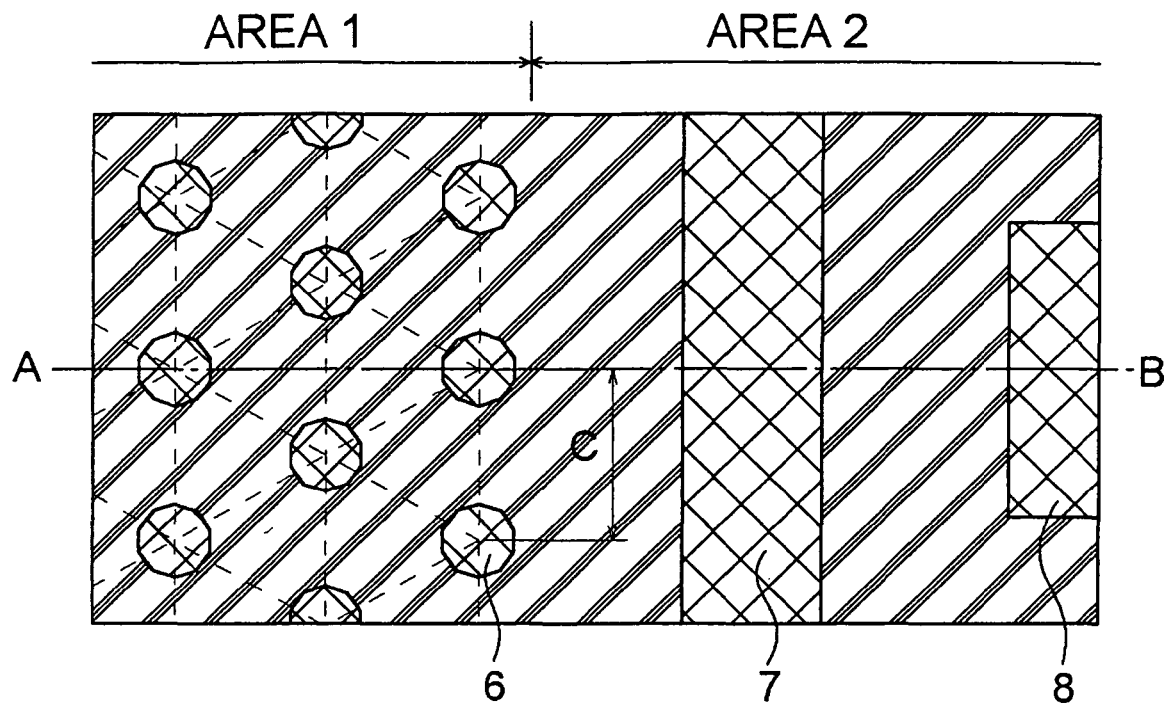
Figure 1B:
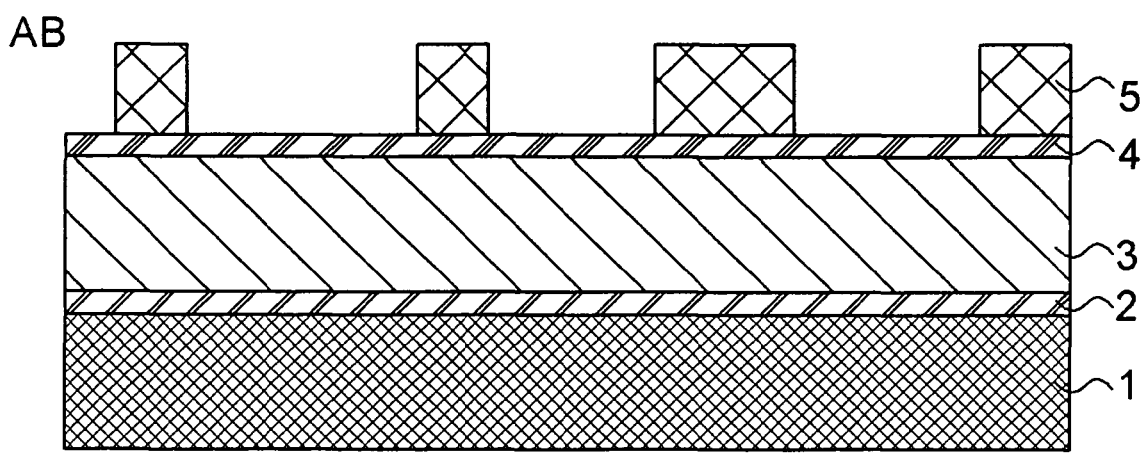

Referring to FIGS. 1A and 1B, amorphous carbon film 1 and silicon oxynitride film 2 are formed on a semiconductor substrate (not shown) as base layers in which holes are intended to be formed. Afterwards, organic antireflection film 3, which will serve as a mask material layer A, and silicon-containing organic film 4, which will serve as a mask material layer B are formed, and photoresist 5 is formed on silicon-containing organic film 4 by a spin coating process. Photoresist 5 is patterned through exposure and development by a photolithography technique, so that dotted patterns 6 are formed in AREA 1, in which holes are intended to be formed, and dummy patterns are formed in AREA 2, in which the holes are not intended to be formed. For example, the dummy patterns include dummy line pattern 7 and dummy rectangular pattern 8. In this example, the diameter of the dotted pattern is set to be 40 nm that is a resolution limit F value of the photolithography technique, the width of the dummy line pattern is set to be 100 nm, and the dummy rectangular pattern is set to be a square pattern with a side thereof being 500 nm. Dotted patterns 6 are arranged to be a triangular lattice layout (pitch C: 100 nm), as shown in the figures. Meanwhile, in the plan views of FIGS. 1A, 2A, 3A, 4A, 5A, 6A, 7A, and 8A, the scales in AREA 1 and AREA 2 are not equal. The dummy pattern is not limited to the line pattern and the rectangular pattern as described above. It is preferred that the size of the dummy pattern be the same as or greater than the pitch of the dotted patterns, and that the dummy pattern be formed in a position that is distanced from the dotted patterns at an interval greater than the pitch of the dotted patterns.

Figure 2A:
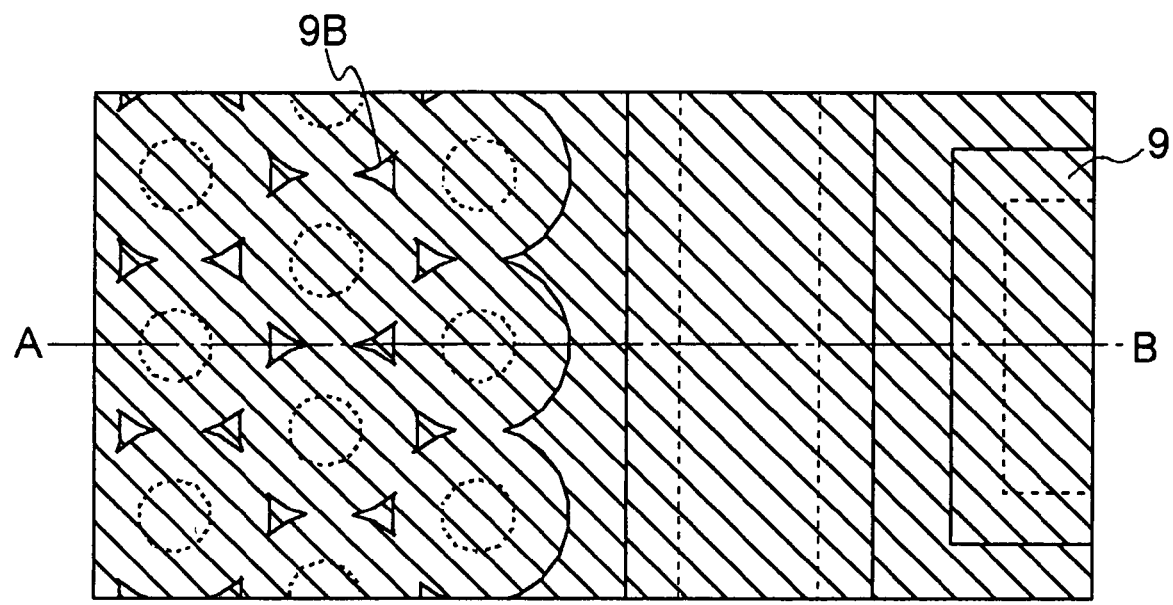
Figure 2B:
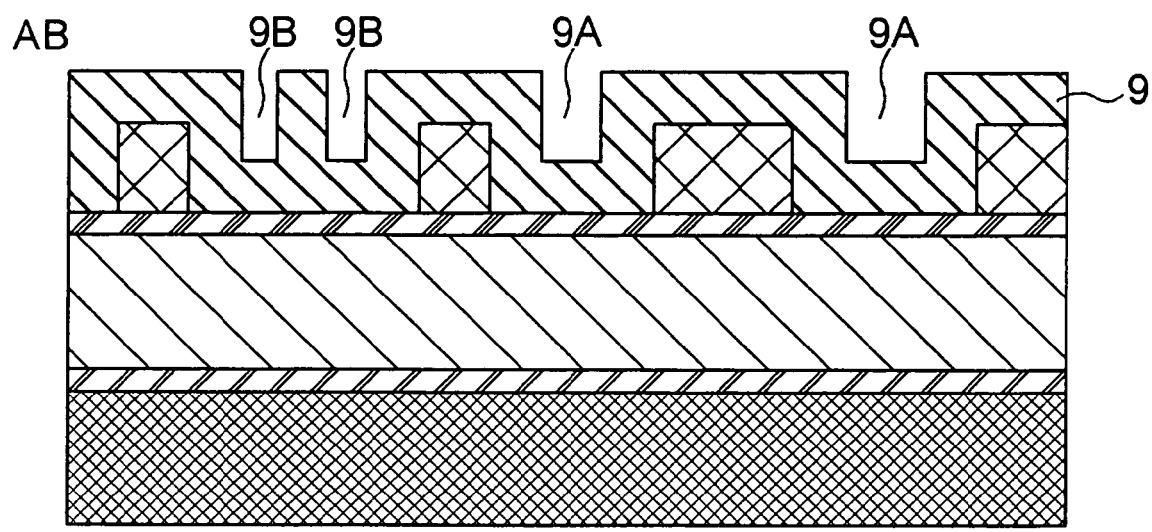

Referring to FIGS. 2A and 2B, silicon dioxide film 9 is formed as a first layer, which will form sidewall spacers, by Atomic Layer Deposition-Chemical Vapor Deposition (ALD-CVD), to a thickness such that the dotted patterns forming the triangular lattice layout in the pitch direction is correctly filled. Here, silicon dioxide film 9 is formed in 30 nm thickness. Consequently, in AREA 1, silicon dioxide film 9 is connected in the direction of each edge of the triangular lattices, whereas substantially triangular recesses 9B are formed in the vicinity of the central portion of each triangular lattice. Recesses 9A are also formed between the dotted pattern and the dummy line pattern and between the dummy line pattern and the dummy rectangular pattern.

Figure 3A:
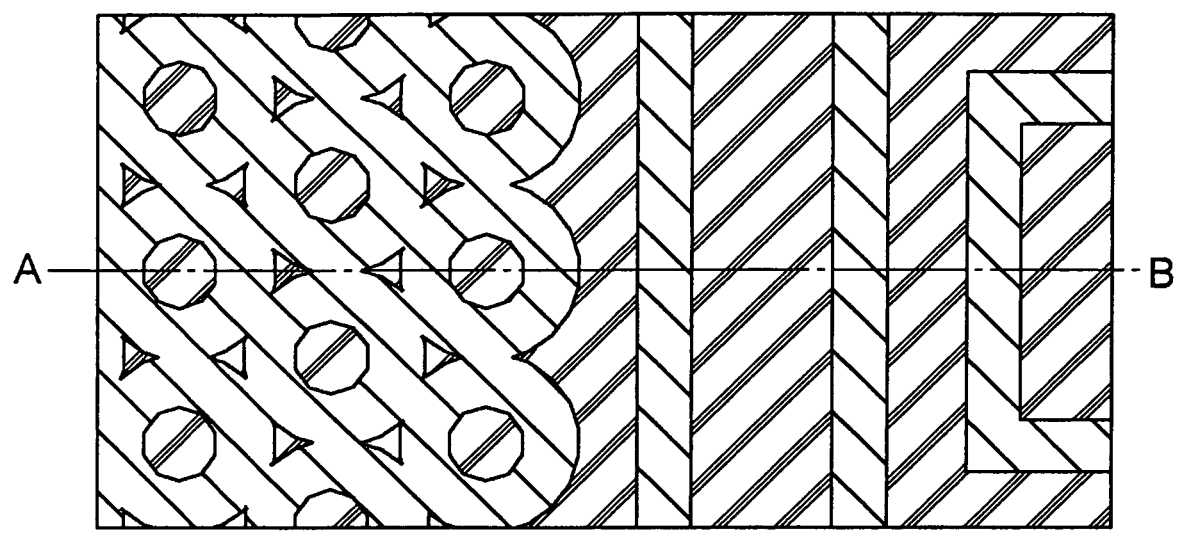
Figure 3B:
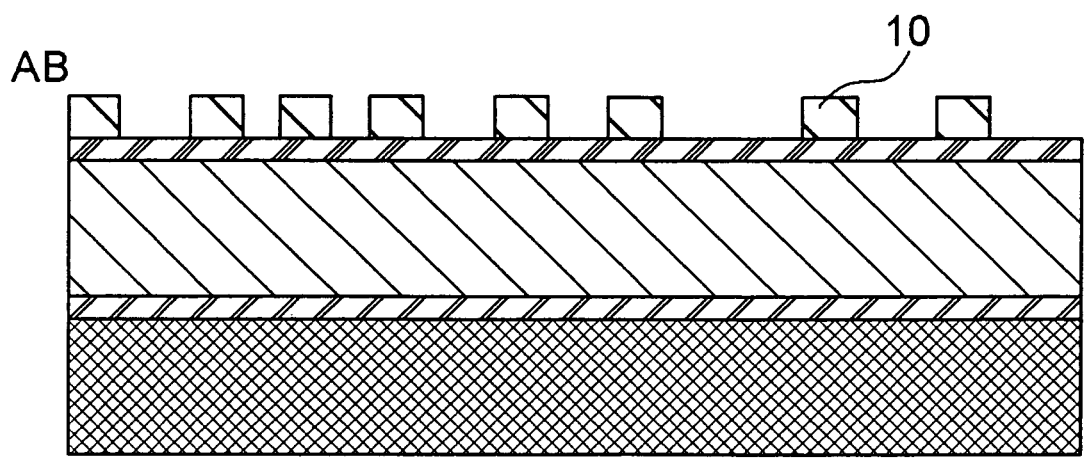

Referring to FIGS. 3A and 3B, silicon dioxide film 9 is etched back to expose the photoresist 5 and then the exposed photoresist 5 is removed by a dry etching technique using oxygen gas. Sidewall spacers 10 are formed by additionally etching back silicon dioxide film 9 until silicon-containing organic film 4 is exposed. In sidewall spacers 10, openings 10C are formed by the removal of photoresist 5, and openings 10A and 10B corresponding to recesses 9A and 9B are formed. In AREA 1, openings 10C, which are formed by removing the dotted photoresist, and openings 10B corresponding to recesses 9B (which are collectively referred to as a "first hole pattern") are formed.

Figure 4A:
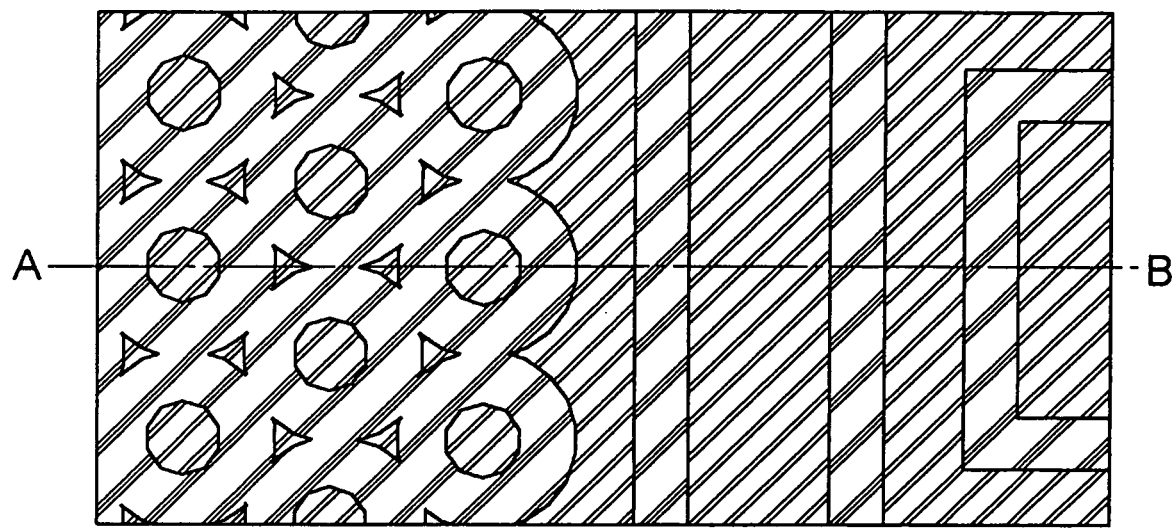
Figure 4B:
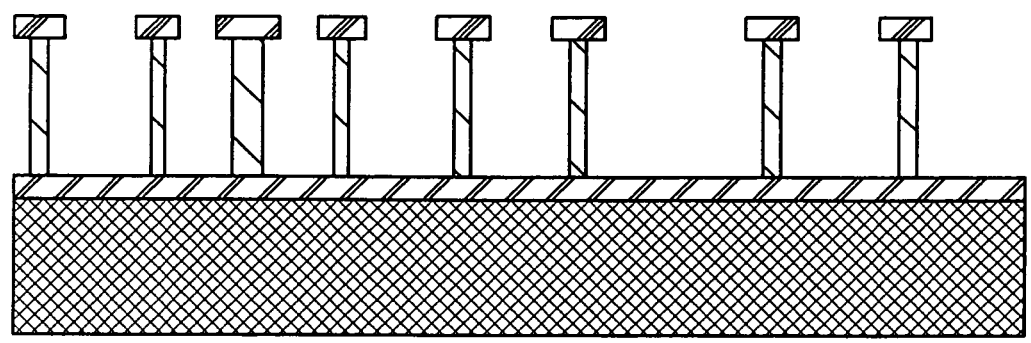

Referring to FIGS. 4A and 4B, silicon-containing organic film 4 and organic antireflection film 3 are sequentially dry etched using sidewall spacers 10 as a mask. Here, by the use of a mixed gas of $CF_4$, $CHF_3$, $CH_2F_2$, Ar, and $O_2$ as an etching gas of silicon-containing organic film 4, silicon-containing organic film 4 is anisotropically and isotropically etched, etching sidewall spacers 10, thereby forming second holes 4B and 4C in the first hole pattern area (openings 10B and 10C). By the anisotropic and isotropic etching of silicon-containing organic film 4, second holes 4B under the substantially triangular openings 10B become slightly similar to a circular shape. In addition, organic antireflection film 3 is isotropically etched using a mixed gas of $O_2$, CO, $N_2$, and $H_2$ as an etching gas, such that it is side-etched to about 10 nm from the pattern formed in silicon-containing organic film 4. Third holes 3B and 3C, which have a substantially circular planar shape, are formed in organic antireflection film 3 under second holes 4B and 4C. The diameters of third holes 3B and 3C are enlarged about 20 nm from those of second holes 4B and 4C, respectively.

Figure 5A:
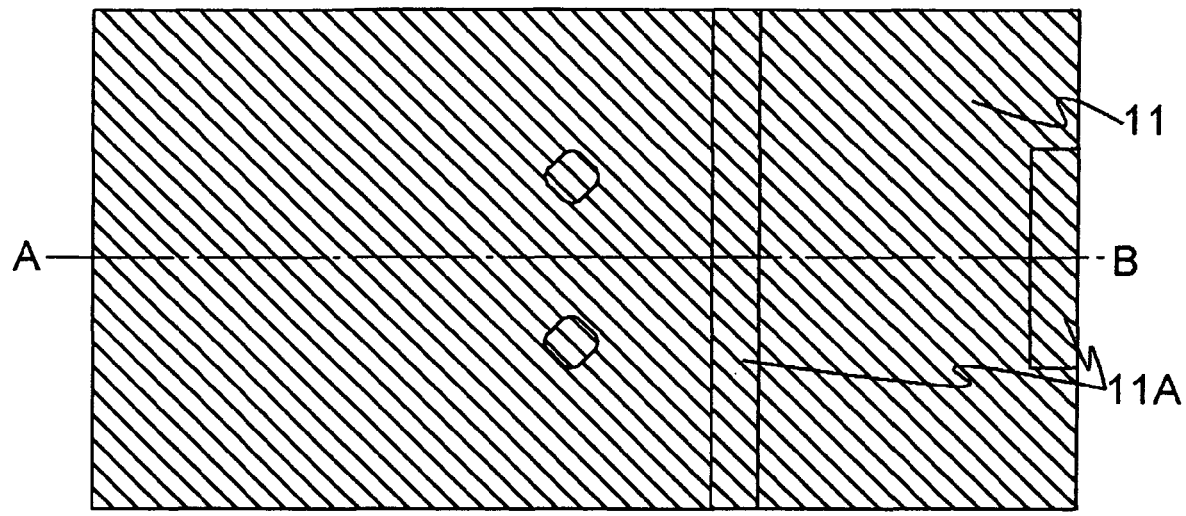
Figure 5B:
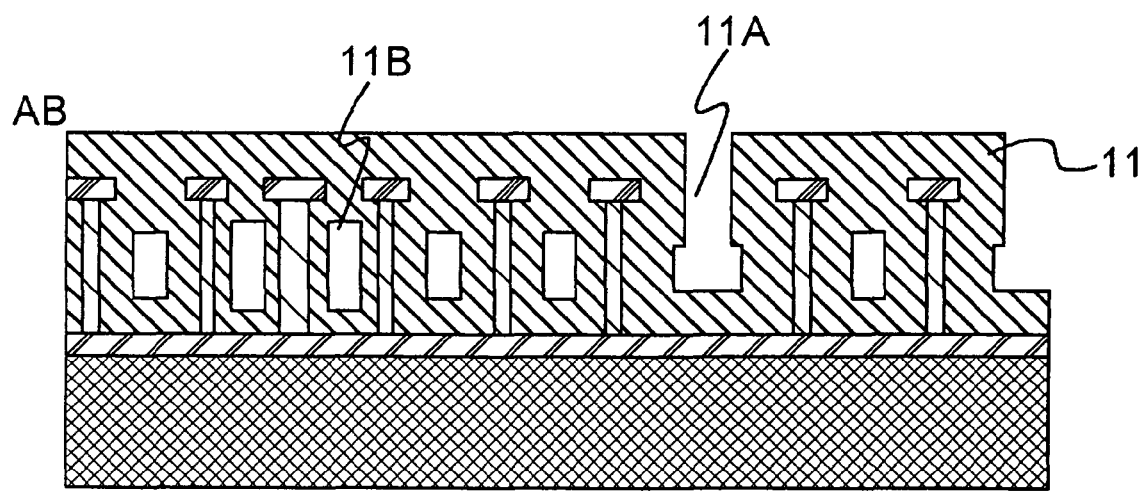

Referring to FIGS. 5A and 5B, second holes 4B and 4C are closed by growing a silicon dioxide film 11, which serves as the second layer, to be 30 nm thickness using ALD-CVD. Here, since the diameters of third holes 3B and 3C, which are formed in organic antireflection film 3, are greater than those of second holes 4B and 4C, which are formed in silicon-containing organic film 4, respectively, voids 11B having a diameter of about 20 nm are formed. Here, voids 11A are also formed in AREA 2. Consequently, a layout having recesses 11D, which are not completely closed, is formed.

Figure 6A:
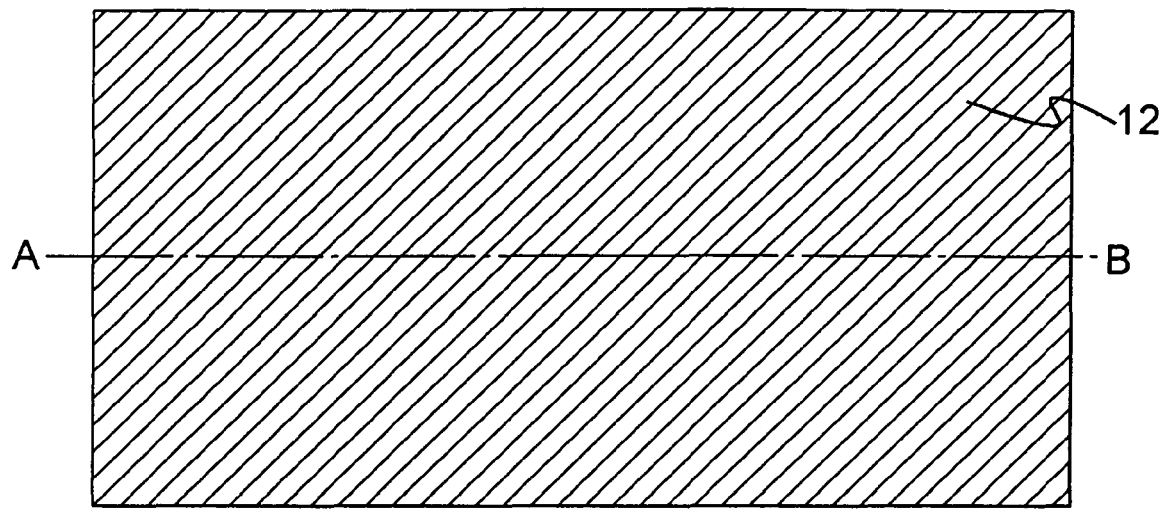
Figure 6B:
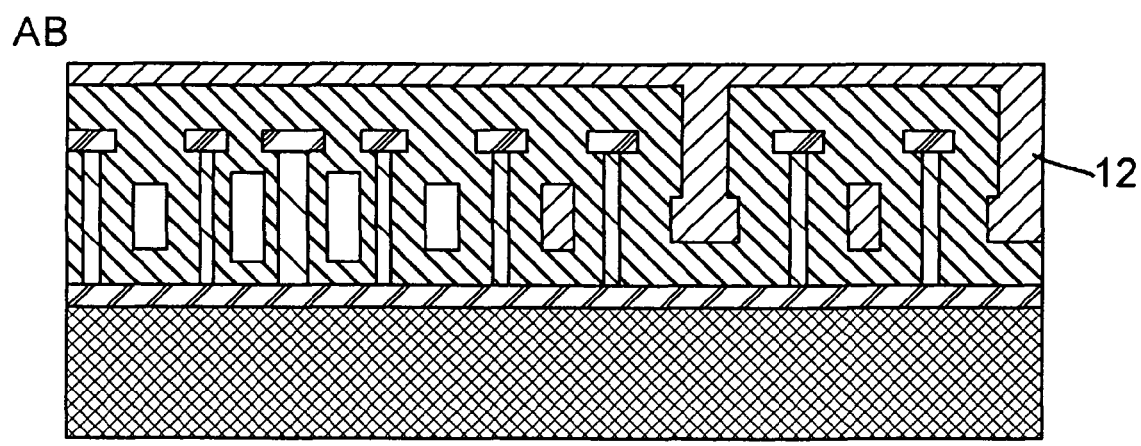

Referring to FIGS. 6A and 6B, organic antireflection film 12 is formed by a spin coating technique, such that organic antireflection film 12 fills voids 11A in AREA 2 by detouring through recesses 11D without filling voids 11B in AREA 1.

Figure 7A:
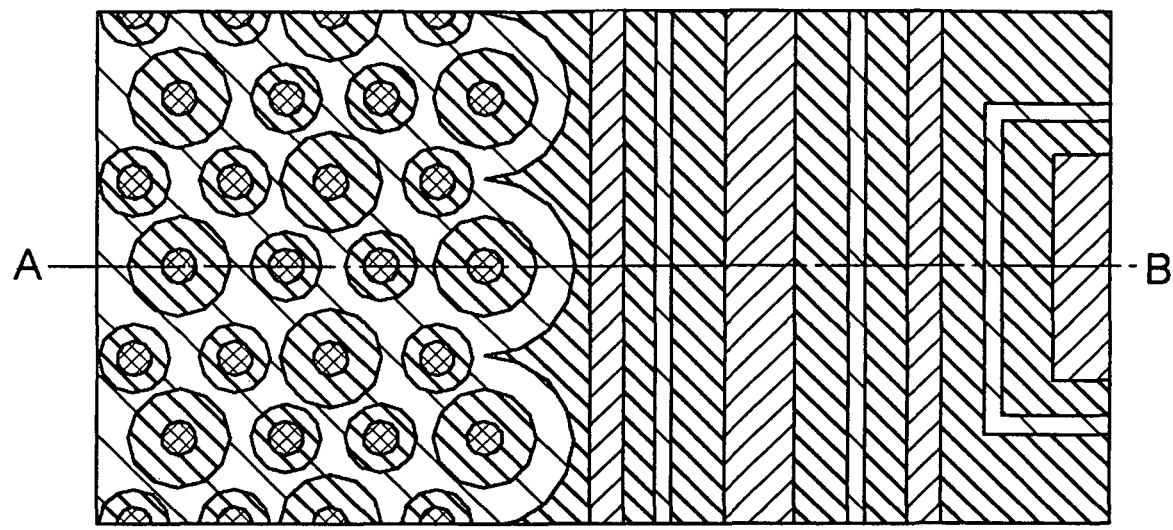
Figure 7B:
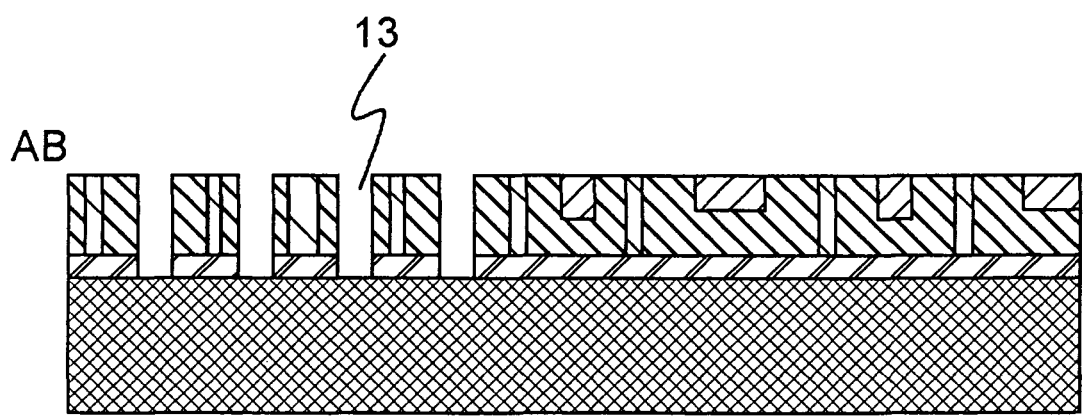

Referring to FIGS. 7A and 7B, fourth hole pattern 13 corresponding to voids 11B is formed by etching back organic antireflection film 12 and silicon oxide film 11 by a dry etching technique.

Figure 8A:
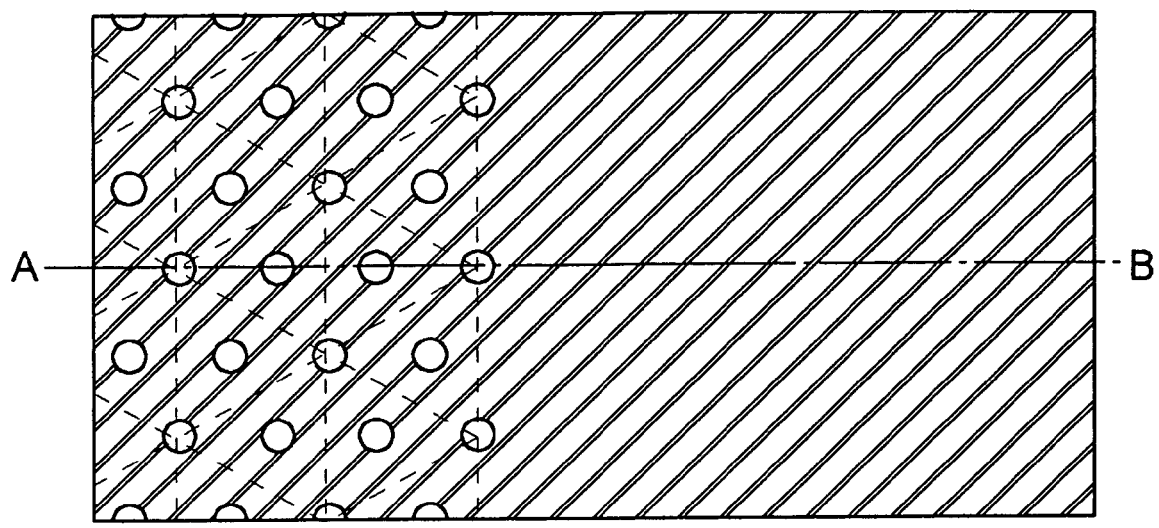
Figure 8B:
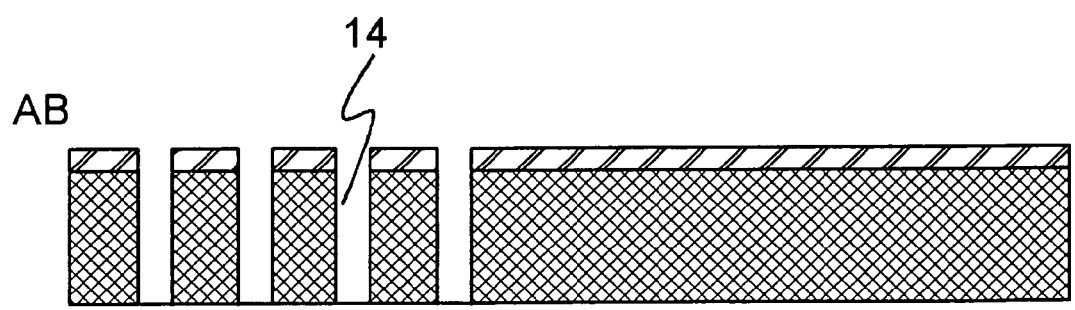

Referring to FIGS. 8A and 8B, holes 14 having a diameter smaller than the lithography limit, with the density thereof being triple that of the first pattern, can be formed by processing silicon oxynitride film 2 using silicon oxide film 11 and organic antireflection films 3 and 12 as a mask and processing amorphous carbon film 1 using silicon oxynitride film 2 as a mask.

Figure 9A:
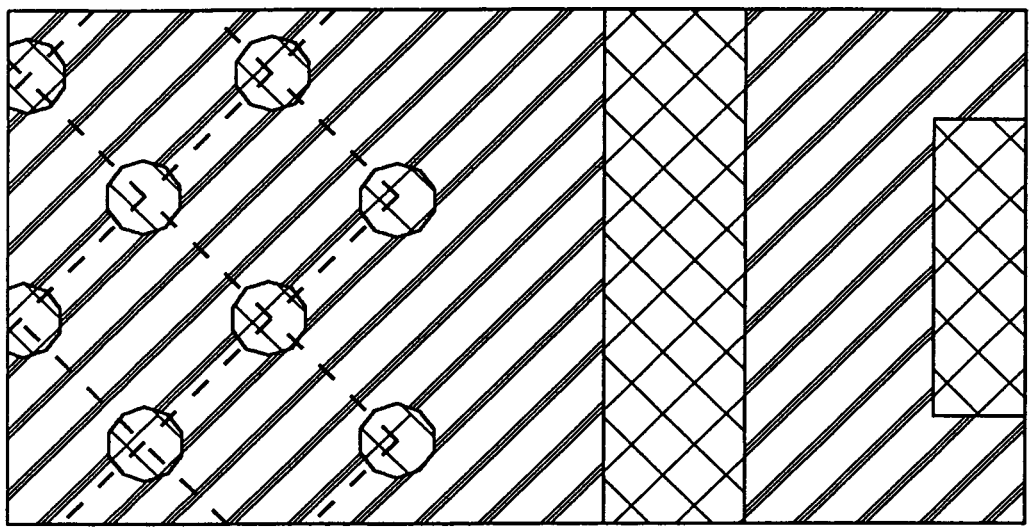
Figure 9B:
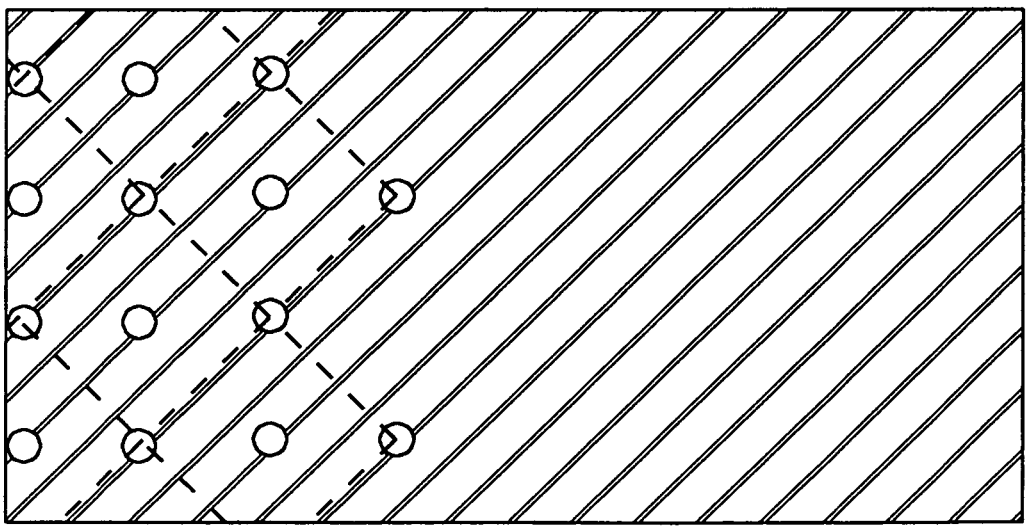

FIG. 9A is a plan view showing a state in which dotted photoresist patterns are arranged in a square lattice layout, and FIG. 9B is a plan view showing a state in which hole patterns are formed in the square lattice layout shown in FIG. 9A according to the present invention. By the arrangement of the dotted pattern in the square lattice layout, holes can be formed, with a uniform diameter that is smaller than the lithography limit, and at a density that is double that of the initial arrangement.

The above-described example illustrated a configuration in which the voids in AREA 2 are buried with the organic antireflection film by forming the organic antireflection film by a spin coating technique in the process of FIGS. 6A and 6B. However, in the present invention, the holes may be formed in AREA 1 as described above by directly performing an etching back process in AREA 2 after the process of FIGS. 5A and 5B, such that the fourth hole pattern corresponding to the voids are exposed, and covering AREA 2 with a photoresist. However, in this case, the photolithography process for patterning the photoresist increases. Therefore, it is preferred that the voids in AREA 2 be disposed in advance using an organic antireflection film as in the foregoing example.

Applications of the present invention may include a semiconductor device, such as DRAM, which is used in an data storage device. In an example, the application of the present invention to contact holes in a cell array of a DRAM semiconductor device makes it possible to stably form DRAM having a dense patterned capacitor, such as 6F2 type.

What is claimed is:

1. A method of manufacturing a semiconductor device, comprising:
   sequentially forming mask material layers A and B on a base layer;
   forming a dotted photoresist pattern in a square or triangular lattice layout on the mask material layer B;
   forming a first insulating film, which is intended to form sidewall spacers, on the photoresist pattern, with a recess left at least in the vicinity of a central portion of the square or triangular lattice layout of the dotted photoresist pattern;
   etching back the first insulating film by dry etching to expose the photoresist, removing the photoresist that is exposed and forming the sidewall spacers by further etching back, wherein the sidewall spacers have a photoresist-removed portion that exposes the mask material B and a first hole pattern corresponding to the recess;

etching the mask material B using the sidewall spacers as a mask to form second holes corresponding to the first hole pattern in the mask material B;

etching the mask material A using the mask material B as a mask to form third holes in the mask material A by, wherein the third holes have a diameter greater than that of the second holes of the mask material B;

forming a second insulating layer on the mask material B to a thickness such that openings of the second holes are closed to form voids in the third holes of the mask material A;

forming a mask pattern exposing the base film in fourth holes corresponding to the voids in the third holes by dry etching; and forming holes corresponding to the fourth holes by etching the base layer using the mask pattern as a mask.

2. The method of claim 1, wherein the mask material A is etched according to an etching condition having an isotropic characteristic.

3. The method of claim 2, wherein the mask material A comprises an organic antireflection film, wherein the third holes are formed by dry etching using an etching gas including oxygen.

4. The method of claim 1, wherein the mask material B is etched according to an etching condition having both isotropic and anisotropic characteristics.

5. The method of claim 4, wherein the mask material B comprises a silicon-containing organic film, wherein the second holes are formed using an etching gas including a fluorinated carbon gas and oxygen.

6. The method of claim 1, wherein the process of forming a dotted photoresist pattern on the mask material B comprises simultaneously forming a dummy photoresist pattern on an area of the mask material B, in which a hole pattern is not formed, the dummy photoresist pattern being greater than the dotted photoresist pattern, wherein the process of forming voids in the third holes of the mask material A comprises forming voids in an area, in which the hole pattern is not formed, to communicate with a recess, which is formed in the second insulating film, and wherein the recess is buried by forming a coating layer on the second insulating film, and the voids in an area, in which the hole pattern is not formed, are filled with the coating layer.

7. The method of claim 1, wherein the dotted photoresist pattern is formed as a pattern having a diameter that is equal to or greater than a resolution limit F value, and wherein the holes formed in the base layer form holes smaller than the dotted photoresist pattern, and the number of the holes is double or triple that of the dotted photoresist pattern in a predetermined area.

* * * * *